United States Patent
Soong et al.

(10) Patent No.: US 6,472,943 B1
(45) Date of Patent: Oct. 29, 2002

(54) OSCILLATING CIRCUIT AND METHOD FOR CALIBRATING SAME

(75) Inventors: Anthony Chak Keung Soong, Superior; Bruce S. Schwartz, Boulder; Kate Jennings Lainson, Lafayette; David Purdy, Louisville, all of CO (US)

(73) Assignee: Telefonaktie Bolaget L.M. Ericsson, Stockholm (SE)

( * ) Notice: Subject to any disclaimer, the term of this patent is extended or adjusted under 35 U.S.C. 154(b) by 0 days.

(21) Appl. No.: 09/834,406

(22) Filed: Apr. 13, 2001

Related U.S. Application Data

(60) Provisional application No. 60/257,682, filed on Dec. 21, 2000.

(51) Int. Cl.[7] .................. H03B 5/32; H03B 21/00; G06F 1/04; H03K 3/011; H03L 1/00
(52) U.S. Cl. ............... 331/44; 331/74; 327/105; 327/291; 327/513
(58) Field of Search ............... 331/18, 44, 74; 327/105–107, 113, 117, 119, 141, 291, 513

(56) References Cited

U.S. PATENT DOCUMENTS

| | | |
|---|---|---|
| 4,454,483 A | 6/1984 | Baylor |
| 5,392,005 A | 2/1995 | Bortolini et al. |
| 5,654,718 A | 8/1997 | Beason et al. |
| 5,892,408 A | 4/1999 | Binder |
| 6,194,970 B1 * | 2/2001 | Nielsen et al. ............ 331/16 |

\* cited by examiner

*Primary Examiner*—David Mis
(74) *Attorney, Agent, or Firm*—Coats & Bennett, P.L.L.C.

(57) ABSTRACT

An oscillating circuit (10) includes a quartz crystal oscillator (12) for generating a clock signal (20). The clock signal is synchronized to a master signal (19) during the lock-in periods when the oscillating circuit (10) has access to the master signal (19). During the holdover periods when the oscillating circuit (10) loses access to the master signal (19), an oscillation frequency function predicts the crystal oscillation frequency in terms the physical parameters, e.g., time and temperature, that may affect the crystal oscillation frequency. The predicted frequency is compared with a standard frequency to generate an error signal. In response to the error signal, a fraction handler block (28) determines whether adding cycles to or deleting cycles from the clock signal, thereby calibrating the oscillation signal (13) of the oscillating circuit (10).

27 Claims, 2 Drawing Sheets

OSCILLATING CIRCUIT AND METHOD FOR CALIBRATING SAME

RELATED APPLICATION DATA

The present application is related to, and claims priority to, U.S. Provisional Patent Application Serial No. 60/257,682, filed Dec. 21, 2000, which is hereby fully incorporated by reference.

FIELD OF INVENTION

The present invention relates, in general, to oscillating timing signals and, more particularly, to circuits and methods for generating and calibrating oscillating timing signals.

BACKGROUND

Oscillators play essential roles in communication and information transfer. They provide clock signals to the circuits communicating with each other. A central part of an oscillator is usually a piece of quartz crystal. A voltage potential is applied across the crystal, causing mechanical vibration at a resonant frequency. The thickness of the crystal determines its nominal oscillating frequency. The crystal oscillating frequency also depends on other factors such as, for example, temperature, the angle of the cut, load capacitance, etc. A voltage controlled crystal oscillator (VCXO) seeks to control the frequency of the oscillator by adjusting the load capacitance of the crystal in the oscillator. A temperature controlled oscillator, which is often referred to as an oven controlled oscillator (OCXO), seeks to increase the frequency stability of the oscillator by adjusting the temperature of the crystal.

When two circuits such as, for example, a base station and a user terminal in a wireless communications network, communicate with each other, the clock signals in the two circuits are preferably synchronized with each other. This can be achieved by using the clock signal in one circuit, e.g., the base station, as the master signal, and synchronizing the clock signal in the other circuit, e.g., the user terminal, to master signal. The clock signals of different circuits, e.g., different base stations in a wireless communication network, can also be synchronized using a common signal, e.g., a public switched telephone network (PSTN) signal, as the master clock signal. Alternatively, the clock signal from a global positioning system (GPS) satellite can serve as the master signal, wherein the clock signals of all base stations in a wireless communication network are synchronized to the GPS signal. That the timing be synchronized between base stations is especially critical during soft hand-offs, where a mobile terminal communicates with more than one base station at the same time.

Because of naturally occurring variations in crystal oscillation frequencies, synchronizing clock signals of different circuits in communication with one another is an ongoing process. For example, in order to synchronize the clock signal in a base station to a master signal from a PSTN or a GPS satellite, the base station must first be able to receive the master signal. In operation, however, the wireless communication base station may temporarily lose contact with the PSTN or GPS satellite, e.g., due to inclement weather conditions or equipment failure. During this "holdover period," the base station cannot synchronize its clock signals to a master signal from the PSTN, or from the GPS satellite.

Accordingly, it would be advantageous to provide synchronization circuits and methods for both generating a clock signal and then for calibrating the clock signal during a period when an oscillating clock circuit is isolated from an outside master synchronization signal. For example, it would be advantageous to have a process for calibrating the clock signal of a base station in a wireless communications network during a holdover period, thereby keeping the base station substantially synchronized with other base stations in the network. Further, it is desirable for the calibration process to take different factors that affect the crystal oscillation frequency into consideration, such as temperature changes and aging.

SUMMARY OF THE INVENTION

In accordance with a general aspect of the invention, a process for generating and calibrating an oscillator clock signal is provided, which enables the clock signal to remain substantially synchronized with clock signals of other common circuit entities, e.g., in a communications network, even when the oscillator loses contact with a master synchronization signal during a holdover period. As used herein, the term "calibration" is to be construed broadly, including without limitation the process of generally synchronizing an oscillator clock signal to a master synchronization signal, as well as the process of calibrating the oscillator clock signal when it is not in contact with the master synchronization signal.

In accordance with a more specific aspect of the invention, the calibration process takes certain physical factors that affect the crystal oscillation frequency into consideration and generates a crystal oscillation frequency function describing the relationship between the crystal oscillation frequency and those factors. For example, the crystal oscillation frequency generally depends on the thickness of the crystal, the load capacitance of the crystal oscillator, the temperature of the crystal, and the age of the crystal. Thus, where the crystal oscillator does not have a variable capacitance load, and the dimension of the crystal in the oscillator does not change over time, temperature and time are the two parameters that may significantly affect the crystal oscillation frequency.

Crystal physical models and experiments show that the temperature effect and the time effect on crystal oscillation frequency are substantially independent of each other. Thus, the crystal oscillation frequency function can be expressed as the sum of two single variable sub functions. One sub function, having temperature as the single variable and referred to as a "temperature function," describes the relationship between the crystal oscillation frequency and the temperature.

In one embodiment, the temperature function is expressed as a polynomial of temperature, wherein the order of the polynomial depends on the crystal model and the desired accuracy.

Other base functions can be used in other embodiments to express the temperature function, e.g., wavelets or a Fourier transformation. Another option is to use an orthogonal basis instead of a transformation function, e.g., wherein statistical data based on prior temperature measurements of a quantity of crystals is used. When a polynomial is used, higher orders of the polynomial give higher accuracy, but are more complex and requires more memory and calculation time. The temperature coefficients in the polynomial are preferably continuously estimated and reevaluated during the periods when the oscillator circuit has access to a master synchronization signal. This continuous estimation and reevaluation process keeps the temperature coefficients updated, so as to accurately describe the relationship between the crystal oscillation frequency and temperature.

The other sub function, having time as the single variable and referred to as a "drift function," describes the relationship between the crystal oscillation frequency and time. The drift function reflects the aging effect of the quartz crystal. Typically, the drift function is a logarithmic function of time with a time constant on the order of weeks, whereas the duration of a holdover period is typically on the order of minute, or hours. During each holdover period, a first order polynomial, i.e., a linear function, with appropriate aging coefficients can express the aging effect of the crystal with sufficient accuracy. Like the temperature coefficients in the temperature function, the aging coefficients in the drift function are preferably continuously estimated and reevaluated during the periods when the oscillator circuit has access to a master synchronization signal. This continuous estimation and reevaluation process keeps the aging coefficients updated, so as to accurately describe the relationship between the crystal oscillation frequency and time. Again, other base functions can be used to express the aging function, e.g., the use of wavelet functions would be well-suited for modeling the aging function, but would add complexity to the system design.

Once the temperature and aging coefficients are known, a crystal oscillation frequency function describing the dependence of the crystal oscillation frequency on temperature and time is determined. During a holdover period, the crystal oscillation frequency function predicts the frequency of the oscillator clock signal. The prediction is compared with a target frequency of the oscillator to generate an error signal, which is also referred to as a calibration signal. A synthesizer is then used to generate a stable clock signal based upon the oscillator output and error signal. The synthesizer is incorporated as part of the existing circuitry for synchronizing the clock signal of the circuit to the master synchronization signal during the lock-in periods, thereby simplifying the calibration process implementation and minimizing the circuit complexity.

Other aspects and features of the invention will become apparent from consideration of the following detailed description taken in conjunction with the accompanying drawings.

DETAILED DESCRIPTION OF PREFERRED EMBODIMENTS

Preferred embodiments of the invention are described herein below with reference to the figures. It should be noted that the figures are only intended to facilitate the description of the preferred embodiments. They are not intended as an exhaustive description or as a limitation on the scope of the present invention.

Figure 1:
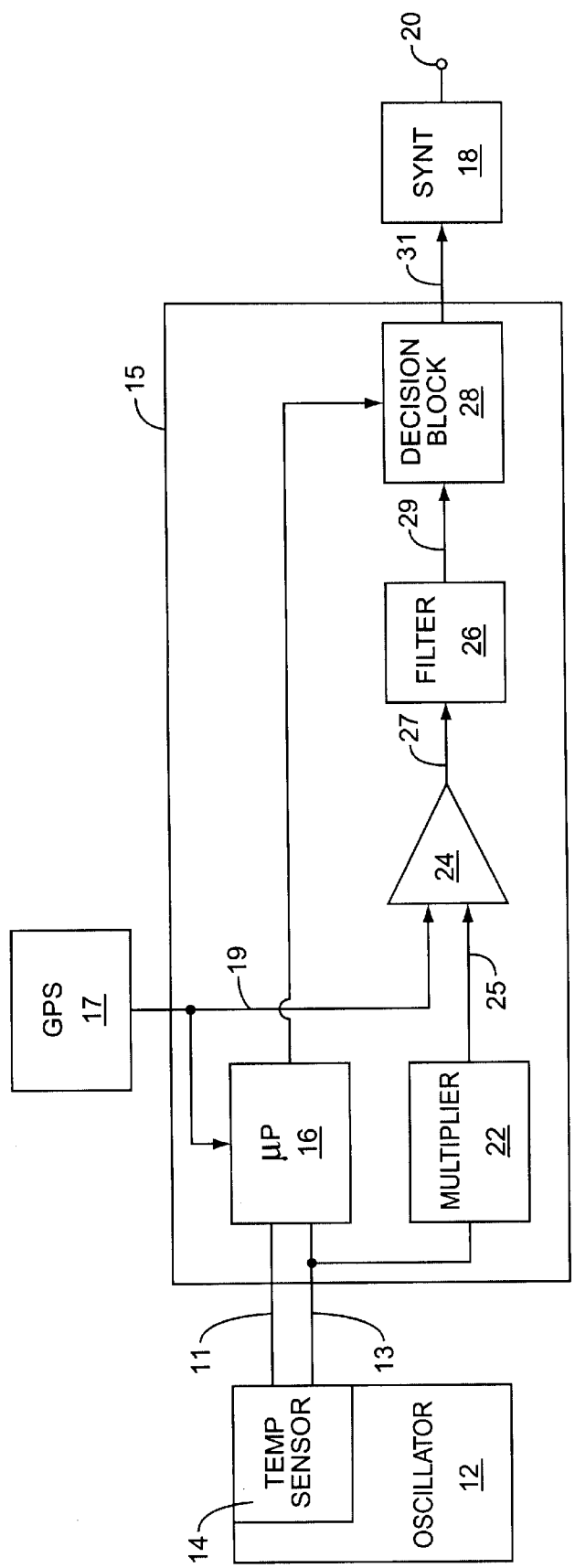
FIG. 1 is a block diagram of a preferred oscillating circuit configured in accordance with an aspect of the invention.

In accordance with a first aspect of the invention, FIG. 1 is a block diagram illustrating an oscillating circuit, or "timing module" 10, which provides a clock signal 20 to a host circuit (not shown). The host circuit can be many kinds of circuits that require the clock signal 20 generated by oscillating circuit 10. By way of example, the host circuit may be in a base station of a wireless communication network.

The timing module 10 includes a quartz crystal oscillator 12. In a preferred embodiment, the oscillator 12 is an oven controlled crystal oscillator (OCXO). By way of example, the oscillator 12 has a nominal frequency, $n_0$, of approximately five megahertz. To generate such a relatively low frequency, the quartz crystal (not shown) in oscillator 12 is relatively thick, e.g., about 1.0024 mm in one embodiment. Thicker crystals are stable because they are more insensitive to crystal cut angle errors.

The oscillator 12 has an attached temperature (e.g. thermo couple) sensor 14 for sensing the temperature of the crystal, although other ways of measuring the crystal temperature may be used, such as measuring the third overtone of the crystal oscillation. The temperature sensor 14 is preferably incorporated in the temperature controlling functions of oscillator 12 to simplify the structure, thereby improving the reliability of the oscillator 12.

The oscillator 12 preferably has a temperature compensated reference voltage output. By way of example, the reference voltage output of oscillator 12 is 3.3 volts. Utilizing this temperature compensated reference voltage, a stable supply voltage is provided to oscillator 12, thereby substantially eliminating supply voltage irregularities as a factor causing the oscillation frequency variation of the oscillator 12. The temperature compensated reference voltage can also serve as a reference for the temperature measurement of the oscillator 12.

The timing module 10 also includes a controller 15 having a microprocessor 16. The controller 15 is coupled to the oscillator 12 for receiving the oscillation signal 13 of oscillator 12 and the temperature reading 11 of temperature sensor 14. The controller 15 is also coupled for receiving a master synchronization signal 19 from a global positioning system (GPS) satellite 17.

The controller 15 includes a frequency generator 22, which receives the frequency output from oscillator 12 and generates a modified frequency signal 25. In one embodiment, the frequency generator 22 includes a frequency multiplier and generates the modified frequency signal 25 by multiplying the frequency output signal 13 of oscillator 12 by a predetermined factor, which is referred to as $\alpha$. The modified frequency signal is used to drive a synthesizer 18 for producing clock signal 20. It will be appreciated by those skilled in the art that use of a multiplier is to provide greater accuracy for characterization of the oscillating crystal. In alternate embodiments, the nominal frequency output signal 13 from oscillator 12 may be used without modification, and the invention is not to be restricted in this regard. A design choice of whether to multiply the frequency is based on balancing the desired accuracy versus system cost and complexity.

During a "lock-in" period, the modified frequency signal is also compared with the master signal 19 from the GPS satellite 17 in a comparator 24. The comparator 24 generates an error signal 27, which is the difference between the master signal frequency and the modified signal frequency. The error signal 27 is input into a proportional and integrator (PI) controller 26. Using a transfer function well known in the art, the PI controller 26 filters the error signal 27. The filtered error signal is input into a fraction handler circuit 28 as a control signal 29.

The fraction handler circuit 28 passes integer portions of the control signal 29 to the synthesizer 18 as a synchronization error signal 31, while accumulating the fractional portions of the control signal 29. When the accumulated sum of the fractional portions of the control signal 29 exceeds one, the fraction handler circuit 28 combines it with the integer portions of the control signal 29 in the synchronization error signal 31.

The purpose of the synchronization error signal 31 is illustrated by considering, by way of example, the crystal oscillator 12 having a nominally frequency of five MHz and driving the synthesizer 18 that is designed to output a stable one Hz signal. A simple synthesizer design to achieve this goal is to employ a counter that counts every oscillation of the crystal oscillator 12, outputs a "clock tick" every time that it counts to five million crystal oscillations, and then zeros the counter for starting the next one second (i.e., five million) count.

However, because of the instabilities inherent in the crystal oscillator 12, the synchronization error signal 31 is used to modify the count total that the counter reaches before outputting a clock tick. In particular, when the synchronization error signal indicates that the crystal oscillation frequency is greater than its nominal frequency, the counter value is increased accordingly. Likewise, when the synchronization error signal indicates that the crystal oscillation frequency is lower than its nominal frequency, the counter value is decreased accordingly. This process necessarily changes the phase of the one Hz output in incremental steps which are equal to an integer multiple of the period of the crystal oscillation. Because the error signal can take on values that are not necessarily integer multiples of the crystal oscillation period, the fraction handler 28 is used to take the remaining fractional periods into account.

Figure 2:
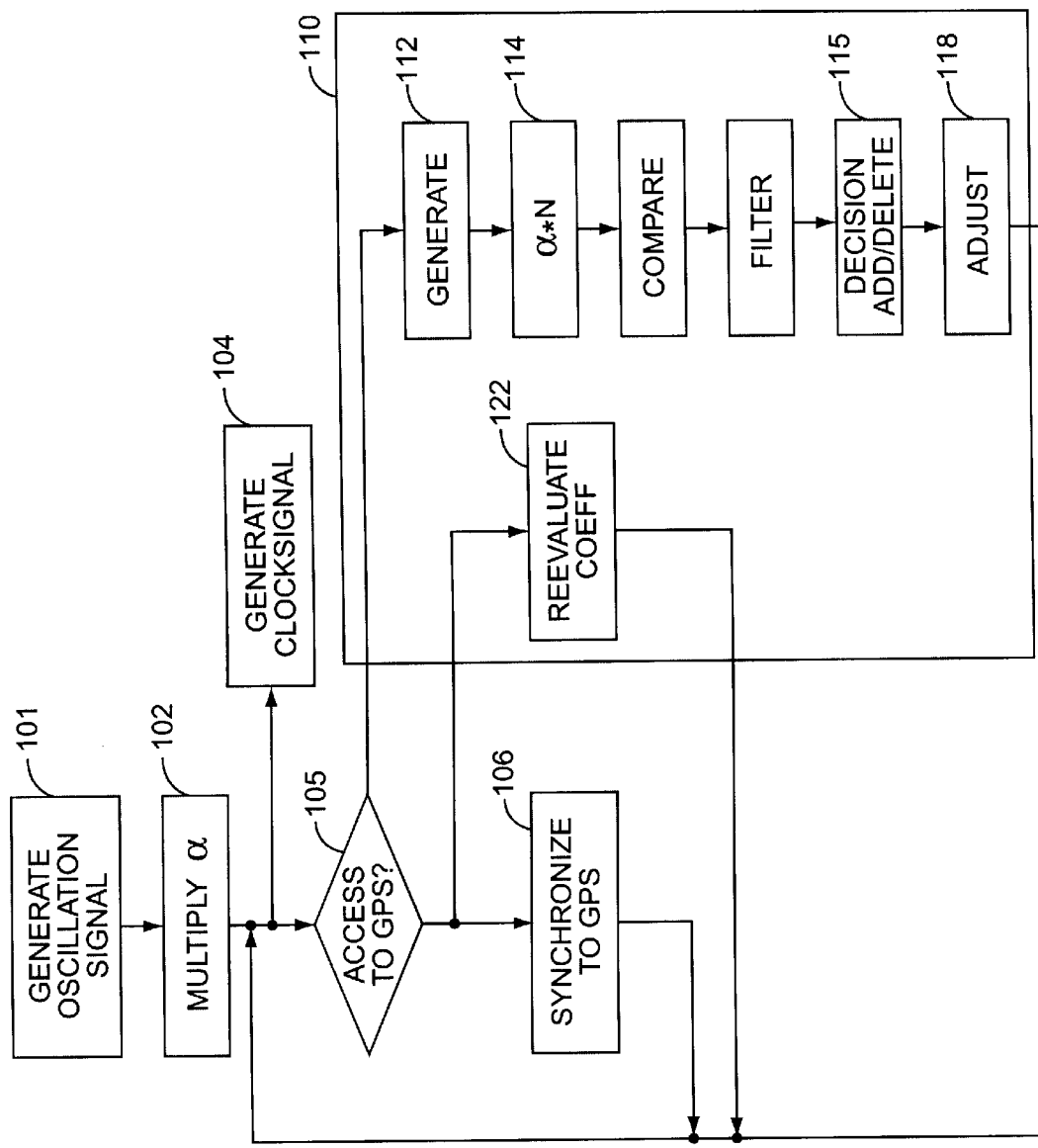
FIG. 2 is a flow chart of a preferred process for calibrating a clock signal in accordance with a further aspect the invention.

In accordance with a further aspect of the invention, FIG. 2 is a flow chart of a preferred process 100 for generating and calibrating a clock signal 20. By way of example, the process 100 for generating and calibrating the clock signal 20 may be implemented using the above-described oscillating circuit timing module 10 of FIG. 1, and is described as such herein.

Referring to FIGS. 1 and 2, process 100 starts with a step 101 of generating an oscillation frequency signal 13 in oscillator 12. At step 102, the oscillation frequency signal 13 is transmitted to frequency signal generator 22, where it is modified by being multiplied by a predetermined factor a. By way of example, the crystal oscillation frequency of oscillator 12 in one embodiment is approximately five MHz and the factor α has a value of sixteen. Thus, the modified frequency signal 25 from frequency signal generator 22 would have a frequency of approximately eighty MHz. As described above with respect to FIG. 1, the modified frequency signal 25 drives synthesizer 18 to generate the clock signal 20 of timing module 10 at step 104.

In a step 105, the timing module 10 detects the accessibility to the master signal/synchronization signal 19 from the GPS satellite 17. When the timing module 10 has access to the master signal 19, the timing module 10 is referred to as operating in a lock-in period. When the timing module 10 loses access to, and is isolated from, the master signal 19, timing module 10 is referred to as operating in a holdover period. The loss of access to the master signal 19 may be caused by routine circuit switching off, adverse weather conditions, equipment failure, etc.

During a lock-in period, the modified frequency signal 25 is synchronized to the master signal 19 in a step 106. The synchronization process first compares the modified frequency signal 25 with the master signal 19 in comparator 24 to generate an error signal 27, which is the phase difference between the master signal 19 and the modified frequency signal 25. The error signal 27 passes through the PI controller 26, which generates a control signal 29 from the error signal 27. The fraction handler 28 receives the control signal 29 and generates a synchronization error signal 31 that determines the number of cycles that need to be added to, or subtracted from, the modified frequency signal 25, thereby synchronizing the clock signal 20 to the master synchronization signal 19 from the GPS satellite 17.

When the timing module 10 loses access to the master synchronization signal 19 and enters the holdover period, a calibration process 110 is activated. In a step 112, the microprocessor 16 in controller 15 takes the physical factors or parameters that affect the crystal oscillation frequency into consideration and generates a crystal oscillation frequency function in terms of those physical parameters. The function predicts the crystal oscillation frequency of oscillator 12 in response to the physical parameters.

Factors or parameters that might affect the frequency of oscillator 12 include the dimension of the crystal in oscillator 12, the temperature of the crystal, and the age of the crystal. The dimension of the crystal is determined at the time of cutting the crystal. Thus, the remaining two major factors or parameters affecting the frequency of oscillator 12 are the age and the temperature of the crystal. The age effect is also referred to as a drift effect.

Experiments show that the drift effect and the temperature effect are substantially independent of each other. The oscillation frequency n of oscillator 12 can therefore be expressed as a function of two parameters, time t and temperature T, in the form:

$$n(t,T)=n_0+\phi(t)+f(T), \quad (1)$$

wherein $n_0$ is the nominal oscillation frequency of the crystal, and $\phi(t)$ and $f(T)$ are the functional descriptions of the drift effect and the temperature effect, respectively, on the crystal oscillation frequency. The nominal frequency $n_0$ is typically provided by the crystal manufacturer and preferably stored in a nonvolatile memory unit (not shown), e.g., an electrically erasable and programmable read only memory (EEPROM) unit in oscillator 12, or in controller 15.

The drift function $\phi(t)$ describes the drift or aging effect of the crystal. Typically, the drift function is a logarithmic function of time with a time constant on the order of weeks. A holdover period typically lasts on the order of minutes or hours, significantly shorter than a week. Thus, a polynomial of the first order, i.e., a linear function, with appropriate aging coefficients can express the drift effect with sufficient accuracy during a holdover period.

The temperature function $f(T)$ can be expressed in terms of many types of basis functions such as, for example, polynomials, wavelets, Fourier series, etc. In one preferred embodiment, a polynomial is used to represent the temperature function $f(T)$, with the order of the polynomial depending on the crystal model and the desired accuracy. Higher polynomial orders may give higher accuracy, but are more complex and require more memory and calculation time. In one embodiment, the temperature function $f(T)$ is expressed by a third order polynomial. Experiments with various types of crystal oscillators have shown that a third order polynomial can represent the temperature function $f(T)$ with sufficient accuracy in most situations.

With the drift effect represented by a linear function and the temperature effect represented by a third order polynomial, the crystal oscillation frequency function is expressed as:

$$n(t,T)=n_0+\kappa t+(AT^3+BT^2+CT)+D, \quad (2)$$

wherein κ is an aging coefficient, A, B, and C are temperature coefficients, and D is a zeroth order coefficient representing the long-term drift effect and the temperature effect on the oscillation frequency of crystal oscillator 12. The initial values of the coefficients κ, A, B, C, and D can be provided by the crystal manufacturer and stored in a non-volatile memory unit in oscillator 12 or in controller 15.

Preferably, the coefficients κ, A, B, C, and D are continuously estimated and reevaluated in a step 122 during lock-in periods when the timing module 10 has access to the master synchronization signal 19. This continuous estimation and reevaluation keeps the coefficient κ, A, B, C, and D updated and accurately describing the crystal oscillation frequency in terms of time and temperature. In a preferred embodiment, the coefficient κ, A, B, C, and D are reevaluated over a period of twenty-four hours by taking 320 pairs of time and frequency readings. In order to improve the accuracy and minimize the memory space needed for storing the data, it is preferred to move the time origin to the beginning of each cycle for reevaluating the aging coefficients. A period of twenty-four hours is chosen because it covers one diurnal temperature cycle. Any one diurnal cycle will usually not cover the entire range of temperatures in which the oscillator circuit is expected to operate, e.g., due to seasonal variations. However, the temperature coefficients evaluated during one diurnal period are generally sufficiently accurate in predicting the oscillation frequency during a holdover period immediately following that diurnal period.

By way of example and in a preferred embodiment, the coefficients κ, A, B, C, and D are reevaluated in step 122 by regression. For example, the coefficient κ can be reevaluated using time regression, and the coefficients A, B, C, and D can be reevaluated using temperature regression. In an alternative embodiment, the coefficients κ, A, B, C, and D are reevaluated together in a multiple variant regression process during the lock-in period.

Experiments show that the quartz crystal has a memory effect in the sense that, at a certain temperature T, the temperature function f(T) may have two values slightly different from each other, one for increasing temperature and one for decreasing temperature. Hence, in one embodiment, where a higher accuracy is desired, the coefficients A, B, C and D are expressed in terms of eight temperature coefficients $A^+$, $A^-$, $B^+$, $B^-$, $C^+$, $C^-$, $D^+$, and $D^-$ as $$A = A^- + \theta(T-T_p)(A^+ - A^-)$$
$$B = B^- + \theta(T-T_p)(B^+ - B^-)$$
$$C = C^- + \theta(T-T_p)(C^+ - C^-)$$
$$D = D^- + \theta(T-T_p)(D^+ - D^-)$$

wherein $T_p$ is the temperature of the crystal at a time earlier than when the temperature T is sensed. Practically, $T_p$ can simply be the last temperature reading before temperature T is sensed for calculating the temperature function f(T). θ is the step function defined as $$\theta(x) = \begin{cases} 0 & (x < 0) \\ 1 & (x \geq 0). \end{cases} \quad (4)$$

Like the coefficients A, B, C, and D in the previously described embodiment, the coefficients $A^\pm$, $B^\pm$, $C^\pm$, and $D^\pm$ can be initially provided by the crystal oscillator manufacturer and stored in a memory in oscillator 12 or in controller 15 and reevaluated in step 122 during the lock-in periods. If an even higher accuracy is desired, the coefficients $A^\pm$, $B^\pm$, $C^\pm$, and $D^\pm$ can be replaced by arrays of coefficients $A_i^\pm$, $B_i^\pm$, $C_i^\pm$, and $D_i^\pm$ with each element in the arrays covering a particular temperature range.

With the aging coefficient, κ and the temperature coefficients, A, B, C, and D, calculated, the crystal oscillation frequency can be determined through the crystal oscillation frequency function as expressed in Equation (2).

When timing module 10 operates in the holdover period, a holdover algorithm in microprocessor 16 operates to essentially provide the controller signal 29 to the fraction handler 28. In particular, the holdover algorithm calculates the current frequency (as multiplied, if applicable) 25 of the oscillator using Equation (2) in step 112. In a step 114, microprocessor 16 calculates an oscillation frequency error signal as $$\alpha(n(t,T)-n_0) = \alpha[\kappa t + (AT^3 + BT^2 + CT) + D]. \quad (6)$$

The error signal transmitted to fraction handler 28 as the control signal. In response to the control signal, fraction handler 28 generates the synchronized error signal 31, which is also referred to as a calibration signal, in a step 115. The calibration signal is transmitted to synthesizer 18, thereby calibrating timing module 10 in a step 118. The operations of fraction handler 28 and synthesizer 18 during a holdover period are substantially the same as those during a lock-in period except that, during the holdover period, the control signal is generated by the microprocessor 16 using the oscillation frequency function n(t,T), whereas during the locking period the control signal is generated by the comparator 24 and PI controller 26 using the master synchronization signal 19 from the GPS satellite.

The holdover period ends when the timing module 10 regains access to the master signal. Timing module 10 again operates in the lock-in period. The clock signal 20 is again synchronized to the master signal in step 106. In addition, the drift and temperature coefficients in the crystal oscillation frequency function n(t,T) are estimated and reevaluated during the lock-in period in step 122. Consequently, during the next holdover period, the clock signal of timing module 10 will be calibrated using the updated crystal oscillation frequency function n(t,T).

As will be appreciated by those skilled in the art, the process 100 for generating a clock signal and calibrating the clock signal as described herein above will keep the clock signals of timing module 10 substantially synchronized with those of other circuits during the holdover periods when timing module 10 is isolated from outside synchronization signals. In one embodiment, the process 100 will keep a base station in a wireless communication network substantially synchronized with other base stations during the holdover periods when the base station loses contact with a PSTN or GPS satellite master signal.

By now it will be appreciated that an oscillating circuit and a method for generating and calibrating an oscillating clock signal have been disclosed and described, in which the oscillating circuit employs uses a crystal oscillator to generate the clock signal. The clock signal can be synchronized to a master synchronization signal during the lock-in periods when the circuit has access to the master signal. When the circuit loses the access to the master signal during the holdover periods, the calibration process will keep the clock signal substantially synchronized with the clock signals of other circuits, e.g., base stations in a wireless communication network.

The calibration process is based on a crystal oscillation frequency function that takes physical conditions such as temperature and time that have effects on the crystal oscillation frequency into consideration. Furthermore, the calibration process continuously updates and reevaluates the crystal oscillation frequency function. Therefore, the calibration process is reliable and accurate. The polynomial form of the crystal oscillation frequency function makes the calibration process simple and memory space efficient. The cycle add and cycle deletion of the calibration process can be performed using the existing circuitry for synchronizing the clock signal of the circuit to the master synchronization signal during the lock-in periods, thereby simplifying the calibration process implementation and minimizing the circuit complexity.

While specific embodiments of the present invention have been described herein above, they are not intended as a limitation on its scope, and modifications and variations of the described embodiments will be apparent to those skilled in the art without departing from the inventive aspects described herein.

For example, sensing the temperature of the oscillator can be performed using methods other than those described herein above. Further, the crystal oscillation frequency function is not to be limited to depending on time and temperature. For example, if the circuit is to perform in a high gravity ("g") environment, the function may depend upon the measure g. The function can also depend on other physical conditions, such as atmospheric pressure, background electromagnetic field, etc. that may affect the crystal oscillation frequency.

In addition, the aging function is not limited to being a linear function of the time. Depending on the desired accuracy, the aging function can be a polynomial of a higher order or a different type of basis function may be used to express the aging function, e.g., the use of wavelet functions would be well-suited for modeling the aging function, but would add complexity to the system design. Similarly, the temperature function is not limited to being a polynomial, as other transformation functions, or even an orthogonal basis based on statistical data, may be used within the scope of the invention to express either of the temperature or aging functions. What is important to the invention is that the factors that influence the crystal oscillation are taken into account in synthesizing an oscillator clock signal, not the particular methodology employed to do so.

What is claimed is:

1. An oscillating clock circuit, comprising:
   a crystal oscillator generating a crystal oscillation signal;
   a controller coupled for receiving the crystal oscillation signal, the controller generating a modified frequency signal from the crystal oscillation signal,
      the controller further coupled for receiving a synchronization signal, the controller generating a first calibration signal based on comparing the modified frequency signal to the synchronization signal,
      the controller further generating a second calibration signal based on predicting a frequency of the crystal oscillation signal in response to a physical parameter of the crystal oscillator; and
   a synthesizer coupled for receiving the modified frequency signal and calibration signals from the controller, the synthesizer generating a clock signal in response to the modified frequency signal and adjusting the clock signal in response to the calibration signals.

2. The oscillating clock circuit of claim 1, the controller generating the second calibration signal in response to the losing access to the synchronization signal.

3. The oscillating clock circuit of claim 1, wherein the physical parameter of the crystal oscillator is age.

4. The oscillating clock circuit of claim 1, wherein the physical parameter of the crystal oscillator is temperature.

5. The oscillating clock circuit of claim 1, the controller comprising a comparator coupled for receiving the modified frequency signal and the synchronization signal, the comparator generating an error signal by comparing the modified frequency signal and the synchronization signal, wherein the first calibration signal is based on the error signal.

6. The oscillating clock circuit of claim 1, the controller comprising a frequency signal generator for generating the modified frequency signal.

7. The oscillating clock circuit of claim 6, wherein the frequency signal generator comprises a frequency multiplier.

8. The oscillating clock circuit of claim 1, the controller configured for predicting the frequency of the crystal oscillation signal as a function of temperature of the crystal oscillator.

9. The oscillating clock circuit of claim 1, the controller configured for predicting the frequency of the crystal oscillation signal as a function of age of the crystal oscillator.

10. The oscillating clock circuit of claim 1, the controller configured for predicting the frequency of the crystal oscillation signal as a function of both temperature and age of the crystal oscillator.

11. An oscillating clock circuit, comprising:
    a crystal oscillator generating a crystal oscillation signal;
    a controller coupled for receiving the crystal oscillation signal and for predicting a frequency of the crystal oscillation signal in response to a physical parameter of the crystal oscillator.

12. The oscillating clock circuit of claim 11, the controller further coupled for receiving a synchronization signal, the controller generating a first calibration signal based on comparing the crystal oscillation signal to the synchronization signal, and a second calibration signal based on the predicted crystal oscillation frequency, the clock circuit further comprising:
    a synthesizer coupled for receiving the crystal oscillation signal and calibration signals from the controller, the synthesizer generating a clock signal in response to the crystal oscillation signal and adjusting the clock signal in response to the calibration signals.

13. The oscillating clock circuit of claim 11, wherein the physical parameter of the crystal oscillator is age.

14. The oscillating clock circuit of claim 11, wherein the physical parameter of the crystal oscillator is temperature.

15. The oscillating clock circuit of claim 12, the controller comprising a comparator coupled for receiving the crystal oscillation signal and the synchronization signal, the comparator generating an error signal by comparing the crystal oscillation signal and the synchronization signal, wherein the first calibration signal is based on the error signal.

16. The oscillating clock circuit of claim 11, the controller configured for predicting the frequency of the crystal oscillation signal as a function of both temperature and age of the crystal oscillator.

17. A method for calibrating an oscillation signal generated by a crystal oscillator, comprising:
    predicting a frequency of the oscillation signal based on a physical parameter of the crystal oscillator.

18. The method of claim 17, wherein the frequency of the oscillation signal is predicted as a function of temperature of the crystal oscillator.

19. The method of claim 17, wherein the frequency of the oscillation signal is predicted as a function of aging of the crystal oscillator.

20. The method of claim 17, wherein the frequency of the oscillation signal is predicted as a function of both temperature and aging of the crystal oscillator.

21. A method for calibrating a clock signal in a base station of a wireless communication network, comprising:

generating a oscillation signal using a crystal oscillator in the base station;

generating a modified frequency signal by multiplying a frequency of the oscillation signal by a predetermined factor;

receiving a master synchronization signal from a global positioning system satellite;

generating the clock signal by synchronizing the modified frequency signal to the master synchronization signal;

generating a predicted oscillation frequency of the crystal oscillator in terms of a physical parameter of the crystal oscillator during a holdover period in which the base station loses access to the master synchronization signal;

generating a calibration signal by comparing the predicted oscillation frequency with a standard frequency during the holdover period; and generating the clock signal during the holdover period by adjusting the modified frequency signal in response to the calibration signal.

22. The method of claim 21, wherein the step of generating a predicted oscillation frequency of the crystal oscillator includes:

generating a temperature function;

sensing a temperature of the crystal oscillator; and generating the predicted oscillation frequency in terms of the temperature in accordance to the temperature function.

23. The method of claim 22, wherein the step of generating a temperature function includes the steps of:

providing a plurality of temperature coefficients; and generating a polynomial of the temperature in terms of the plurality of temperature coefficients.

24. The method of claim 23, the step of providing a plurality of temperature coefficients including providing a first set of temperature coefficients and a second set of temperature coefficients; and the step of generating a polynomial of the temperature including generating the polynomial of the temperature using the first set of temperature coefficients in response to an increasing temperature and using the second set of temperature coefficients in response to a decreasing temperature.

25. The method of claim 23, the step of providing a plurality of temperature coefficients including:

storing a plurality of initial values for the plurality of temperature coefficients in a memory unit; and reevaluating the plurality of temperature coefficients over a twenty four hour period in response to the base stating having access to the master synchronization signal.

26. The method of claim 23, the step of generating the predicted oscillation frequency of the crystal oscillator further including:

generating a drift function in terms of a time; and generating the predicted oscillation frequency in terms of the temperature and the time in accordance to a sum the temperature function and the drift function.

27. The method as claimed in claim 21, the step of generating the clock signal including performing an action selected from a group of actions including:

adding at least one cycle to the modified frequency signal to generate the clock signal;

deleting at least one cycle from the modified frequency signal to generate the clock signal; and passing the modified frequency signal as the clock signal.

* * * * *